United States Patent

Hori et al.

[11] Patent Number: 6,159,300
[45] Date of Patent: Dec. 12, 2000

[54] APPARATUS FOR FORMING NON-SINGLE-CRYSTAL SEMICONDUCTOR THIN FILM, METHOD FOR FORMING NON-SINGLE-CRYSTAL SEMICONDUCTOR THIN FILM, AND METHOD FOR PRODUCING PHOTOVOLTAIC DEVICE

[75] Inventors: Tadashi Hori; Shotaro Okabe, both of Nara; Akira Sakai, Kyoto; Yuzo Kohda, Kyotanabe; Takahiro Yajima, Kyoto, all of Japan

[73] Assignee: Canon Kabushiki Kaisha, Tokyo, Japan

[21] Appl. No.: 08/990,915

[22] Filed: Dec. 15, 1997

[30] Foreign Application Priority Data

Dec. 17, 1996 [JP] Japan .................................. 8-353512

[51] Int. Cl.$^7$ ................................................ C23C 16/00
[52] U.S. Cl. .................... 118/718; 118/723 E; 118/724
[58] Field of Search ................................ 118/718, 723 E, 118/723 MW, 724

[56] References Cited

U.S. PATENT DOCUMENTS

| | | | |
|---|---|---|---|
| 4,400,409 | 8/1983 | Izu et al. | 427/39 |
| 4,609,771 | 9/1986 | Guha et al. | 136/249 |
| 4,729,341 | 3/1988 | Fournier et al. | 118/723 |
| 4,960,488 | 10/1990 | Law et al. | 156/643 |

FOREIGN PATENT DOCUMENTS

| | | |
|---|---|---|
| 0106521 | 4/1984 | European Pat. Off. . |
| 0106521A | 4/1984 | European Pat. Off. . |
| 0406691 | 1/1991 | European Pat. Off. . |
| 0406691A | 1/1991 | European Pat. Off. . |
| 0574178 | 12/1993 | European Pat. Off. . |
| 0574178A | 12/1993 | European Pat. Off. . |

OTHER PUBLICATIONS

Patent Abstracts of Japan, vol. 13, no. 230 (E–764), May 26, 1989 re: Publication No. 01036085
Patent Abstracts of Japan, vol. 13, no. 230 (E–764), May 26, 1989 re: Publication No. 01036085.

*Primary Examiner*—Richard Bueker
*Assistant Examiner*—Parviz Hassanzadeh
*Attorney, Agent, or Firm*—Fitzpatrick, Cella, Harper & Scinto

[57] ABSTRACT

An apparatus for forming a non-single-crystal semiconductor thin film comprising a film deposition chamber having a film-forming space surrounded by a film deposition chamber wall and a beltlike substrate, and an external chamber surrounding the deposition chamber wall is provided. While the beltlike substrate is moved in a longitudinal direction, a film-forming gas is introduced through a gas supply device into the film-forming space and microwave energy is radiated from a microwave applicator into the film-forming space to induce a microwave plasma, and thereby form a non-single-crystal semiconductor thin film on a surface of the beltlike substrate. A cooling mechanism and a temperature-increasing mechanism are provided to cover a part of an outside surface of the deposition chamber wall. An apparatus for forming a non-single-crystal semiconductor thin film where the gas supply device comprises a gas manifold set apart from the deposition chamber wall is another embodiment.

4 Claims, 4 Drawing Sheets

APPARATUS FOR FORMING NON-SINGLE-CRYSTAL SEMICONDUCTOR THIN FILM, METHOD FOR FORMING NON-SINGLE-CRYSTAL SEMICONDUCTOR THIN FILM, AND METHOD FOR PRODUCING PHOTOVOLTAIC DEVICE

BACKGROUND OF THE INVENTION

1. Field of the Invention

The present invention relates to an apparatus and method for continuously forming a non-single-crystal semiconductor thin film and, for example, to an apparatus and method for mass-producing photovoltaic devices of large area such as photovoltaic devices of amorphous silicon or an amorphous silicon alloy. More particularly, the invention concerns controlling means for controlling the temperature of walls of a film-forming chamber and the introduction of a film-forming gas so as to obtain a functional deposited film with high quality.

2. Related Background Art

In recent years, research and development has been conducted and is under way for electric power generation methods with solar cells utilizing the sunlight, as clean power generation methods that can support the increase in demand for power in the future without causing environmental destruction, because they do not pose the problems of contamination with radioactive emissions, global warming, and so on, because the sunlight comes down all over the earth and thus the energy source is not localized, and because relatively high power generation efficiency is achieved without necessitating complex and large-scale facilities.

For the electric power generation methods using solar cells to meet the demand for power, they have to satisfy fundamental requirements. For example, the solar cells used must have sufficiently high photoelectric conversion efficiency, must have excellent stability of characteristic, and must be mass-producible.

Under such circumstances, the solar cells drawing attention are those produced by using a readily available source gas such as silane and decomposing it under glow discharge, thereby depositing a semiconductor thin film of amorphous silicon (hereinafter referred to as "a-Si") or the like on a relatively cheap substrate such as glass, a metal sheet, or the like. The solar cells produced using amorphous silicon are readily mass-producible and because they have the possibility of being produced at lower cost than the solar cells produced using single-crystal silicon or the like. A variety of proposals have been made heretofore on their basic structures, production methods, and so on.

The following technology is known as a conventional method for forming the photovoltaic device.

For example, fabrication of photovoltaic devices using non-single-crystal semiconductor films or the like has been conducted by using the plasma CVD process and has been industrialized. However, the photovoltaic devices are required to have sufficiently high photoelectric conversion efficiency, excellent stability of characteristic and mass-producibility.

To meet theses requirements, fabrication of the photovoltaic devices using the non-single-crystal semiconductor films or the like must achieve improvements in electrical, optical, photoconductive, or mechanical characteristics as well as in fatigue characteristics or operating environment characteristics in repetitive use. Such fabrication must allow mass production with repeatability by high-speed film formation while also achieving an increase of film area and uniformity of film thickness and film quality. It is thus pointed out that these are problems to be solved in the future.

Many electric power generation methods using the photovoltaic devices employ a method for connecting unit modules in series or in parallel to form a unit, thereby obtaining desired electric current and voltage. In that case each module is required to be free of wire breaking and short circuits. In addition, an important requirement is that there are no variations in output voltage and output current among the modules.

The characteristic uniformity of the semiconductor layers is the most important factor for determining characteristics of the unit module, at least in the stage of forming each unit module. From the viewpoints of facilitating module designing and simplifying module assembling steps, providing a semiconductor deposited film excellent in the characteristic uniformity over a large area is required in order to enhance mass producibility of photovoltaic devices and to achieve great reduction of production cost.

Proposed as an efficient mass production method of photovoltaic devices is a method for producing an amorphous-silicon-based solar cell, in which independent film-forming chambers for formation of the respective semiconductor layers are provided and each semiconductor layer is formed in each film-forming chamber therefor.

Incidentally, U.S. Pat. No. 4,400,409 discloses a continuous plasma CVD system employing the roll-to-roll method.

This system can continuously fabricate the device having a semiconductor junction by providing a plurality of glow discharge regions, setting a sufficiently long, flexible substrate of a desired width, and continuously conveying the substrate in the longitudinal direction thereof while depositing the semiconductor layers of the desired conduction types in the respective glow discharge regions.

In the U.S. patent, gas gates are used in order to prevent the dopant gas used upon formation of each semiconductor layer from diffusing or mixing into other glow discharge regions.

Specifically, the system employs means for separating the glow discharge regions from each other by a slit-shaped separation passage and for forming a flow of scavenging gas, for example Ar, $H_2$, or the like, in the separation passage. Therefore, this roll-to-roll method is a method suitable for mass production of the semiconductor device.

However, the formation of each semiconductor layer is carried out by the plasma CVD process using RF (radio frequency) and thus there is a limit to increasing the film deposition rates while maintaining the characteristics of films continuously formed.

Specifically, for example, even in the case where a semiconductor layer is formed in the thickness of at most 2000 Å, there does exist a method for always inducing a predetermined plasma throughout a considerably long and large area and maintaining the plasma uniform.

Skills are, however, necessary for this method and it is thus rather difficult to generalize various plasma control parameters.

In addition, decomposition efficiency and utilization-efficiency of source gases used for formation of film is not so high, which is one of the causes of raising the production cost.

On the other hand, the plasma process using the microwave is drawing attention recently. Since the frequencies of microwaves are short, the energy density can be increased more than in the conventional cases using RF. Microwaves are thus suitable for efficient generation and continuation of plasma.

For example, U.S. Pat. No. 4,729,341 discloses a low-pressure microwave CVD process and system for depositing a photoconductive semiconductor thin film on a large-area cylindrical substrate by a high-power process using a pair of radiation type waveguide applicators.

Taking the above circumstances into consideration, a mass-producing method of higher throughput can be obtained by rationally combining the microwave plasma CVD process (hereinafter referred to as "µW-CVD process") with the roll-to-roll production method, both being said to be suitable for mass production.

There was, however, the following problem in the roll-to-roll µW-CVD process.

The problem is that the input microwave power is not used only for decomposition of source gases for forming a deposited film, but also the microwave power indirectly heats the wall of the deposition chamber forming the film-forming space through the high plasma density, or the microwave itself directly heats the wall to high temperature. The temperature of the wall of deposition chamber starts increasing at the same time as input of microwave power; after a certain period of time has passed, it reaches the terminal temperature determined by a discharge power value or the like. It may reach 350° C. or even about 450° C. depending upon the conditions.

As a result, there arose the following problems.

The first problem is that the temperature of the beltlike substrate for film deposition increases due to the high temperature of the wall of deposition chamber, so that the substrate temperature cannot be maintained around 250° C., which is normally considered to form a deposited film with good quality.

Solar cells fabricated under such circumstances will have low conversion efficiency.

Further, the second problem is that, depending upon the material for the deposition chamber, the temperature could reach near the softening point of the material, whereby the wall of deposition chamber would be damaged.

Specifically, for example, when aluminum is used for the wall of deposition chamber, the temperature near 450° C. will deform screwing portions, portions under tensile stress, etc. to make them of no use.

In order to prevent such an accident, a high-melting-point material should be selected or a cooling means for preventing the increase in the temperature of the wall of deposition chamber needs to be provided.

The third problem is as follows. In the case where a gas manifold for uniformly supplying the film-forming gas into the film-forming space is installed through a part of the wall of the deposition chamber, increase of temperature will also be seen in the gas manifold itself because of the increase in the temperature of the deposition chamber wall as described above. This promotes thermal decomposition of the film-forming gas in the gas manifold, thus greatly degrading initial characteristics of solar cells, and degrading the uniformity of characteristics, because of the temporal temperature increase in the gas manifold during the long-term formation of film.

In view of these problems, though the roll-to-roll µW-CVD process is a method suitable for mass production of semiconductor devices, the further improvements in the photoelectric conversion efficiency, characteristic stability, and characteristic uniformity, and the reduction of production cost are necessary for widespread and volume use of the photovoltaic device, as described previously.

Particularly, for the improvements in the photoelectric conversion efficiency and characteristic stability, each unit module should be preferably produced with as high photoelectric conversion efficiency and as low characteristic deterioration rate as possible.

Further, when the unit modules are connected in series or in parallel to form a unit, a unit module having the minimum current or voltage among the unit modules constituting the unit limits and determines the characteristics of the unit. Therefore, it is very important to decrease the characteristic variation of the unit modules, as well as improving the average characteristics of each unit module. It is thus demanded that the characteristic uniformity of the semiconductor layers themselves which is the most important factor for determining the characteristics of the unit modules, be secured in the stage of forming the unit modules.

It is also strongly demanded that the yield be increased by decreasing defects of the semiconductor layers so as to avoid the breaking of wires and short circuits in each module, to decrease the production cost.

SUMMARY OF THE INVENTION

An object of the present invention is to provide a method and apparatus for forming on a substrate a non-single-crystal semiconductor thin film of a large area, having high photoelectric conversion efficiency, high quality and excellent uniformity, and having less defects with higher repeatability, thereby solving the problems in the above conventional producing means of photovoltaic device, particularly, to provide an apparatus and method of producing a non-single-crystal semiconductor thin film for mass production of photovoltaic devices.

Another object of the present invention is to provide an apparatus of forming a non-single-crystal semiconductor thin film comprising: a film deposition chamber having a film-forming space surrounded by a film deposition chamber wall and a beltlike substrate; an external chamber surrounding the deposition chamber wall; gas supply means; and microwave applicator means, wherein while the beltlike substrate is moved in a longitudinal direction thereof, a film-forming gas is introduced through the gas supply means into the film-forming space and microwave energy is radiated from the microwave applicator means into the film-forming space to induce a microwave-excited plasma therein, thereby forming a non-single-crystal semiconductor thin film on a surface of the beltlike substrate, and wherein a cooling mechanism and a temperature-increasing mechanism are provided such that the mechanisms cover a part of an outside surface of the deposition chamber wall.

Still another object of the present invention is to provide an apparatus of forming a non-single-crystal semiconductor thin film comprising: a film deposition chamber having a film-forming space surrounded by a film deposition chamber wall and a beltlike substrate; an external chamber surrounding the deposition chamber wall; and a gas supply means, wherein while the beltlike substrate is moved in a longitudinal direction thereof, a film-forming gas is introduced through the gas supply means into the film-forming space and a plasma is induced in the film-forming space, thereby forming a non-single-crystal semiconductor thin film on a surface of the beltlike substrate, and wherein the gas supply means comprises a gas manifold, the gas manifold being provided apart from the deposition chamber wall.

A further object of the present invention is to provide a method of forming a non-single-crystal semiconductor thin film by use of a semiconductor thin film forming apparatus comprising a film deposition chamber having a film-forming space surrounded by a film deposition chamber wall and a beltlike substrate, an external chamber surrounding the deposition chamber wall, a gas supply means, and a microwave applicator means, which method comprises, while the beltlike substrate is moved in a longitudinal direction thereof, introducing a film-forming gas through the gas supply means into the film-forming space and radiating microwave energy from the microwave applicator means into the film-forming space to induce a microwave-excited plasma therein, thereby forming a non-single-crystal semiconductor thin film on a surface of the beltlike substrate, wherein the thin film is formed while a temperature control is carried out by a cooling mechanism and a temperature-increasing mechanism provided such that the mechanisms cover a part of an outside surface of the deposition chamber wall.

A still further object of the present invention is to provide a method of forming a non-single-crystal semiconductor thin film by use of a semiconductor thin film forming apparatus comprising a film deposition chamber having a film-forming space surrounded by a film deposition chamber wall and a beltlike substrate, an external chamber surrounding the deposition chamber wall, and a gas supply means, which method comprises, while the beltlike substrate is moved in a longitudinal direction thereof, introducing a film-forming gas through the gas supply means into the film-forming space and inducing a plasma in the film-forming space, thereby forming a non-single-crystal semiconductor thin film on a surface of the beltlike substrate, wherein the gas supply means comprises a gas manifold, the gas manifold being provided apart from the deposition chamber wall.

A still further object of the present invention is to provide a method of producing a photovoltaic device comprising a step of forming a thin film of a non-single-crystal semiconductor using either one of the aforementioned forming methods.

When in the present invention the microwave applicator is used in the apparatus comprising the deposition chamber wall of the outside surface comprising a surface of the beltlike substrate, an applicator surface having the applicator means, an exhaust surface having gas exhaust means, and a normal surface other than the surfaces, the cooling mechanism and temperature-increasing mechanism are preferably provided on the applicator surface or on the normal surface, thereby controlling the temperature.

In the present invention, the gas manifold for uniformly supplying the film-forming gas into the film-forming space is provided apart from the film deposition chamber wall, whereby the gas manifold can be prevented from increasing its temperature with increase in the temperature of the film deposition chamber wall.

DESCRIPTION OF THE PREFERRED EMBODIMENTS

As described above, in the present invention, the apparatus has the structure for controlling the temperature by the cooling mechanism and the temperature-increasing mechanism provided such that the mechanisms cover the external wall surface of a part of the deposition chamber wall. This prevents the increase in the temperature of the wall surface of deposition chamber due to the energy of plasma and permits deposition of film to be carried out at uniform temperature during the film deposition step for a long period of time. Further, the gas manifold for uniformly supplying the film-forming gas into the film-forming space is provided away from the deposition chamber. This can avoid the increase in the temperature of the gas manifold due to the increase in the temperature of the deposition chamber wall and can suppress the thermal decomposition of film-forming gas in the gas manifold. Therefore, the photovoltaic devices with uniform characteristics can be provided, especially, by the deposition of film at a stable temperature for a long period of time, while improving the output characteristics of photovoltaic device. In the present specification the "gas manifold" means a chamber for dividing a gas introduced from an inlet pipe into multiple flow baths.

Further, the present invention can realize extremely good pin junctions, particularly in the stack type photovoltaic device, and higher-quality photovoltaic devices can be uniformly formed with high repeatability.

An example of the film-forming apparatus (deposition apparatus) of forming a semiconductor thin film and the method of producing a photovoltaic device using the apparatus according to the present invention will be described in further detail by reference to the drawings.

Figure 1:
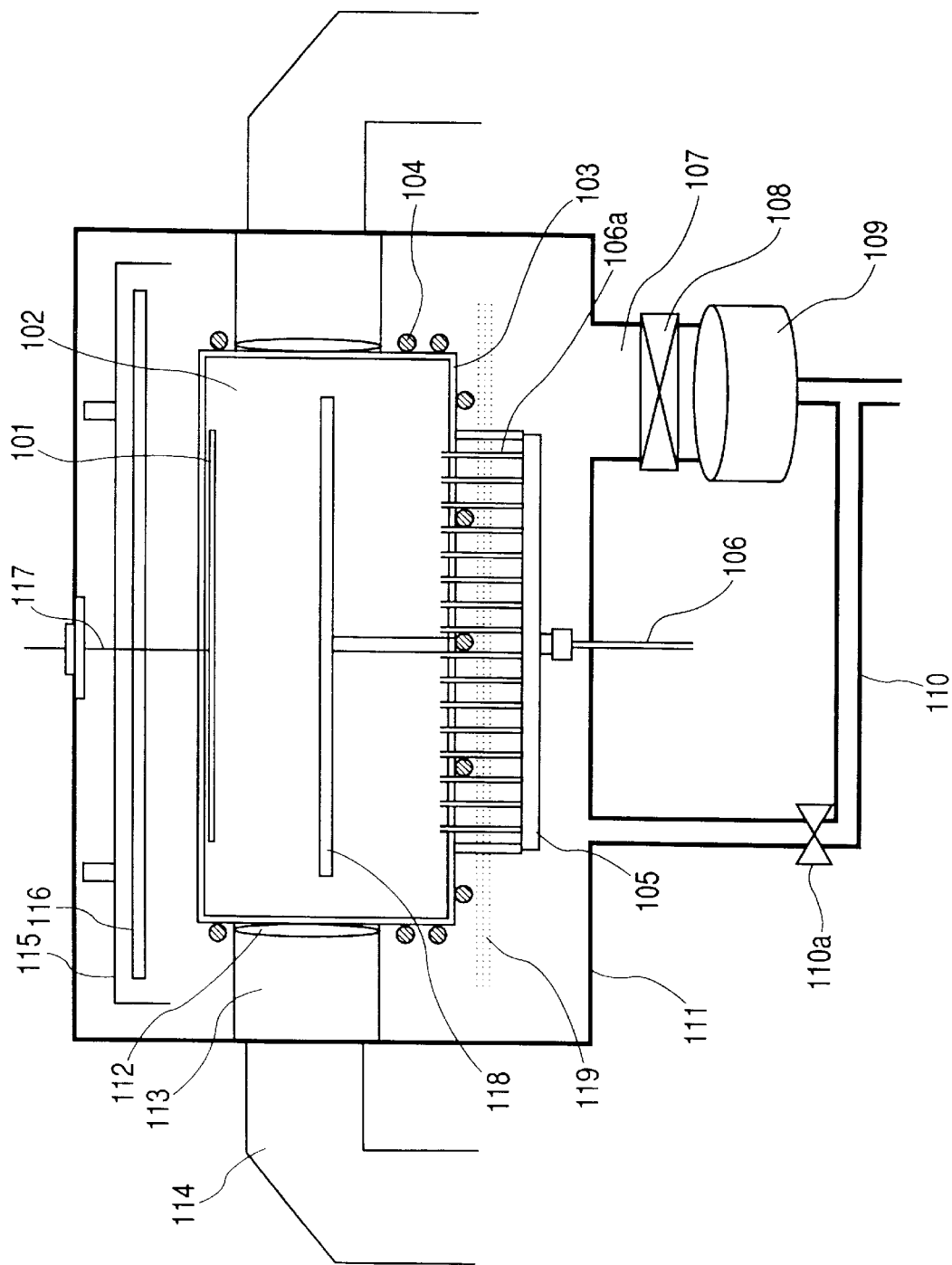
FIG. 1 is a schematic, cross-sectional view of a film-forming apparatus for showing an example of the present invention.

FIG. 1 is a schematic, cross-sectional view of the film-forming apparatus for showing an example of the present invention.

In FIG. 1 reference numeral 101 designates a beltlike substrate, 102 a film deposition chamber, 103 the wall of the film deposition chamber, 104 a cooling pipe through which a refrigerant (cooling medium) for cooling the deposition chamber wall flows, 105 a gas manifold set apart from the deposition chamber wall in order to eliminate or reduce the influence of temperature of the deposition chamber, 106 a gas supply pipe (inlet pipe) for supplying the film-forming gas to the gas manifold, and 106a branch pipes for supplying multiple flow baths of divided gas to the deposition chamber. Numeral 107 denotes an exhaust pipe for exhaust during deposition, 108 a gate valve, 109 an oil diffusion pump, 110 a pipe for roughing evacuation, and 110a an L-shaped valve in the pipe for roughing evacuation. Numeral 111 is an i-type semiconductor layer deposition vessel in the present example, but it should be noted that the present invention is by no means limited to it. Numerals 112, 113, and 114 denote an alumina ceramic, an applicator, and a waveguide tube, respectively, forming a microwave power introducing path for inducing microwave discharge in the deposition chamber. Numerals 115 and 116 are a lamp house and an infrared lamp heater, respectively, for increasing the temperature of the beltlike substrate to a predetermined temperature, and 117 is a thermocouple for control. Numeral 118 represents a bias bar for applying RF power, and 119 a wall heater for increasing the temperature of the deposition chamber wall to a predetermined temperature.

Figure 2:
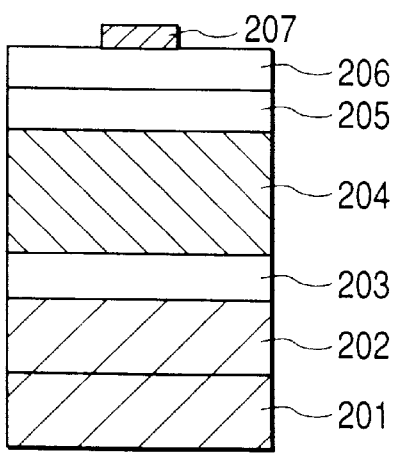
FIG. 2 is a schematic, cross-sectional view for showing an example of a photovoltaic device produced by using the film-forming apparatus of the present invention.

FIG. 2 shows an example of a cross section of a photovoltaic device produced by the film-forming apparatus of the present invention. It should be, however, noted that the present invention is not limited to only production of the photovoltaic device of the structure of FIG. 2. In FIG. 2, numeral 201 designates a substrate, 202 a back electrode, 203 an n-type semiconductor layer, 204 an i-type semiconductor layer, 205 a p-type semiconductor layer, 206 a transparent electrode, and 207 a collector electrode. FIG. 2 shows the structure to which light is incident from the p-type semiconductor layer side, but, in the case of a photovoltaic device of the structure to which the light is incident from the n-type semiconductor layer side, 203 denotes the p-type semiconductor layer, 204 the i-type semiconductor layer, and 205 the n-type semiconductor layer. Further, FIG. 2 shows the structure in which the light is incident from a side opposite to the substrate side, but, in the case of a photovoltaic device of the structure in which the light is incident from the substrate side, the structure may be arranged so that the positions of the transparent electrode and the back electrode are exchanged and 202 denotes the transparent electrode, 203 the p-type semiconductor layer, 204 the i-type semiconductor layer, 205 the n-type semiconductor layer, and 206 the back electrode.

Figure 3:
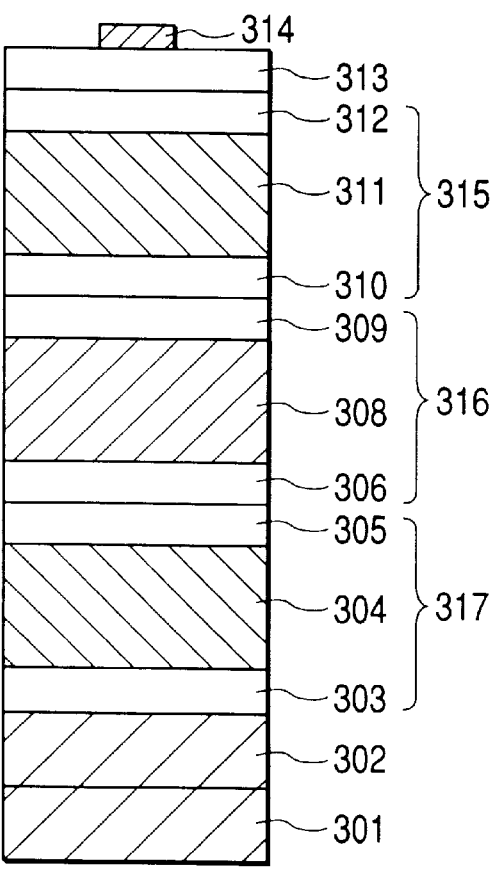
FIG. 3 is a schematic, cross-sectional view for showing an example of a stack type photovoltaic device produced by using the film-forming apparatus of the present invention.

FIG. 3 shows an example of a cross section of a stack type photovoltaic device produced by the film-forming apparatus of the present invention. The stack type photovoltaic device of the present invention shown in FIG. 3 has the structure in which three pin junctions are stacked, wherein 315 indicates the first pin junction from the light incidence side, 316 the second pin junction, and 317 the third pin junction. These three pin junctions are stacked on the back electrode 302 formed on the substrate 301, and the transparent electrode 313 and the collector electrode 314 are formed on the top of the three pin junctions, thus forming the stack type photovoltaic device. Each of the pin junctions is composed of an n-type semiconductor layer 303, 306, 310, an i-type semiconductor layer 304, 308, 311, and a p-type semiconductor layer 305, 309, 312, respectively. Locations of the doped layers (the p-type semiconductor layers and n-type semiconductor layers) and the electrodes will be changed depending upon the direction of incidence of the light, as in the photovoltaic device of FIG. 2.

The photovoltaic devices of non-single-crystal silicon in the present invention will be described in further detail as to each of the substrate, back electrode, light reflecting layer, semiconductor layers, transparent electrode, and collector electrode forming the layer structure.

First described is the substrate. Since the semiconductor layers 203 to 205, 303 to 312 of the present invention are thin films of at most about 1 $\mu$m, they are deposited on an appropriate substrate. The substrates 201, 301 may be either of a single crystal nature or of a non-single-crystal nature. Further, they may be electrically conductive or electrically insulative.

Further, they may be transparent or not transparent to the light, and they are preferably those having a desired strength while having little deformation and distortion.

Specifically, the substrates are selected from thin plates of metals such as Fe, Ni, Cr, Al, Mo, Au, Nb, Ta, V, Ti, Pt, or Pb, or alloys thereof, e.g. brass, stainless steel, and so on, and composites thereof; films or sheets of heat-resistant synthetic resins, such as polyester, polyethylene, polycarbonate, cellulose acetate, polypropylene, polyvinyl chloride, polyvinylidene chloride, polystyrene, polyamide, polyimide, or epoxy, or composites thereof with glass fibers, carbon fibers, boron fibers, metal fibers, or the like; materials obtained by subjecting the surface of the thin plates of the foregoing metals, the foregoing resin sheets, and so on to a surface coating treatment such as a sputtering method, a vapor deposition method, a plating method, or the like with a metal thin film of a different material and/or an insulating thin film of $SiO_2$, $Si_3N_4$, $Al_2O_3$, AlN, or the like; glasses; ceramics; and so on.

When the substrate is electrically conductive like the metals or the like, it may be used directly as an electrode for extracting the electric current. When the substrate is electrically insulative like the synthetic resins or the like, the electrode for extraction of electric current should be desirably formed on the surface at the side where the deposited film is to be formed, by preliminarily performing a surface treatment and by plating, vapor deposition, sputtering, or the like with a so-called single metal or an alloy such as Al, Ag, Pt, Au, Ni, Ti, Mo, W, Fe, V, Cr, Cu, stainless steel, brass, nichrome, $SnO_2$, $In_2O_3$, ZnO, or ITO, and a transparent conductive oxide (TCO).

It is a matter of course that even in the case where the substrate is electrically conductive like the metals or the like, another metal layer of a different kind or the like may be provided on the side where the deposited film is to be formed on the substrate, for the purposes of increasing the reflectivity of long-wavelength light on the surface of substrate, preventing mutual diffusion of constitutive elements between the material of substrate and the deposited film, and so on.

In the case where the substrate is relatively transparent and where the photovoltaic device is constructed in the layer structure to which the light is incident from the substrate side, it is desired that a conductive thin film such as the aforementioned transparent conductive oxide or metal thin film be preliminarily deposited on the substrate.

As for the surface property, the substrate may have a so-called smooth surface or a surface with fine unevenness.

In the case where the substrate has the surface with fine unevenness, the uneven shape is of a spherical shape, a cone shape, a pyramid shape, or the like and the maximum height thereof (Rmax) is preferably 0.05 $\mu$m to 2 $\mu$m, whereby reflection of light on the surface becomes irregular reflection to increase optical pathlengths of light reflected on the surface.

The shape of the substrate may be a plate shape with a smooth surface or with an uneven surface, a long belt shape, a cylindrical shape, or the like, depending upon its purpose of use. The thickness of the substrate is properly determined so as to be enough to form the photovoltaic device as desired. When flexibility is necessitated as a photovoltaic device, or when the light is incident from the substrate side, the thickness can be as thin as possible within the limits to serve a function of the substrate.

However, the thickness is normally not less than 10 $\mu$m in terms of fabrication, handling and mechanical strength of the substrate, and so on.

Next described is the back electrode. The back electrodes 202, 302 used in the present invention are those disposed on the back surface of semiconductor layers in respect of the surface of incidence of light.

Accordingly, the back electrode is located at the position of 202 in FIG. 2 or, in the case where the substrate 201 is transparent and the light is incident from the substrate side, it is located at the position of 206. A material for the back electrode is selected from metals such as gold, silver, copper, aluminum, nickel, iron, chromium, molybdenum, tungsten, titanium, cobalt, tantalum, niobium, or zirconium, or alloys such as stainless steel.

Among them, particularly preferred materials are the metals with high reflectivity such as aluminum, copper, silver, or gold. When the back electrode is made of a metal with high reflectivity, the back electrode can also serve as a light reflecting layer for reflecting light not absorbed by the semiconductor layers again toward the semiconductor layers.

The surface of the back electrode may be flat, but it is more preferably of an uneven shape that scatters light.

When the back electrode has the uneven shape that scatters the light, it can lengthen the optical pathlengths in the semiconductor layers by scattering the long-wavelength light not absorbed by the semiconductor layers and thus enhance the sensitivity of the photovoltaic device with respect to long wavelengths to increase the short-circuit current, thereby increasing the photoelectric conversion efficiency. The uneven shape for scattering the light is desirably such that the maximum of difference between heights of top and bottom of unevenness (Rmax) is 0.2 $\mu$m to 2.0 $\mu$m. There are, however, some cases not requiring formation of the back electrode, where the substrate also serves as the back electrode.

The back electrode is formed using a method selected from the vapor deposition method, the sputtering method, the plating method, the printing method, and so on.

When the uneven shape for scattering the light is formed on the back electrode, it is formed by subjecting a film of a metal or an alloy provided on the substrate to dry etching, wet etching, sand blasting, or heating, or the like. The uneven shape for scattering the light can also be formed by evaporating the aforementioned metal or alloy while heating the substrate.

Although not illustrated in the drawings, a diffusion preventing layer of electrically conductive zinc oxide or the like may be provided between the back electrode 202, 302 and the n-type semiconductor layer 203, 303. The effects of the diffusion preventing layer include not only the effect of preventing the metal element forming the back electrode 202 from diffusing into the n-type semiconductor layer, but also the effect of preventing a short circuit from occurring at a defect or pinhole or the like between the back electrode 202 and the transparent electrode 206 which interpose the semiconductor layers, by providing a small resistance for the diffusion preventing layer, the effect of confining the incident light in the photovoltaic device by multiple interference in the thin films, and so on.

Non-single-crystal semiconductors, specifically, amorphous semiconductors, microcrystalline semiconductors, and polycrystalline semiconductors, are used for the semiconductor layers used in the present invention. Materials for the semiconductor layers are preferably selected from semiconductors containing one kind of elements belonging to Group IV of the periodic table (Group IV-element) such as Si, C, or Ge, or containing two or more kinds of elements belonging to Group IV of the periodic table (Group IV-alloy) such as SiGe, SiC, or SiSn.

Among the above semiconductor materials, those particularly suitably applicable to the photovoltaic devices of the present invention are Group IV-element-based amorphous semiconductor materials and Group IV-alloy-based amorphous semiconductor materials such as a-Si:H (denoting hydrogenated amorphous silicon), a-Si:F, a-Si:H:F, a-SiGe:H, a-SiGe:F, a-SiGe:H:F, a-SiC:H, a-SiC:F, or a-SiC:H:F. Further, microcrystalline semiconductor materials containing a Group IV-element or a Group IV-alloy are also suitably applicable.

The valence electron and bandgap of the semiconductor layers can be controlled.

Specifically, in forming a semiconductor layer, a raw-material compound including an element as a valence electron controller or a bandgap controller is introduced singly or as mixed with a source gas for forming a deposited film or with a diluent gas, into the film-forming space.

At least parts of the semiconductor layers are doped to become p-type and n-type respectively by the valence electron control, thereby forming at least one pin junction. When a plurality of pin junctions are stacked, a so-called stack type cell is constructed.

The semiconductor layers made of the Group IV-element-based non-single-crystal semiconductor materials and Group IV-alloy-based non-single-crystal semiconductor materials particularly suitable for the photovoltaic devices of the present invention will be described in further detail.

(1) I-type semiconductor layer (intrinsic semiconductor layer, hereinafter referred to as "i-type layer")

Particularly, in the photovoltaic devices produced using the Group IV-element-based and Group IV-alloy-based non-single-crystal semiconductor materials, the i-type layer used in the pin junction is an important layer for generating carriers under irradiation of light and transporting them.

As the i-type layer, the Group IV-element-based and Group IV-alloy-based non-single-crystal semiconductor materials which can also be used in a slight p-type or slight n-type semiconductor layer contain hydrogen atoms (H, D) or halogen atoms (X) having important functions, as described above.

The hydrogen atoms (H, D) or halogen atoms (X) contained in the i-type layer function to compensate for dangling bonds of the i-type layer, thereby increasing the product of mobility and lifetime of carriers in the i-type layer. They also act to compensate for interface states in each interface between the p-type semiconductor layer (hereinafter referred to as "p-type layer") and the i-type layer and between the n-type semiconductor layer (hereinafter referred to as "n-type layer") and the i-type layer, thereby revealing the effects of increasing the photoelectromotive force and photocurrent in the photovoltaic device and enhancing the optical response thereof. The optimum content of the hydrogen atoms or/and halogen atoms contained in the i-type layer is 1 to 40 atomic %. Particularly, a preferred distribution of the hydrogen atoms or/and halogen atoms is one in which contents of hydrogen atoms or/and halogen atoms are higher on each interface side between the p-type layer and the i-type layer and between the n-type layer and the i-type layer, and in which a preferred range of the contents of the hydrogen atoms or/and halogen atoms near the interfaces is a range of 1.1 to 2 times as large as those in the bulk. Further, in the preferred distribution, the contents of the hydrogen atoms or/and halogen atoms vary in correspondence to contents of silicon atoms.

In the stack type photovoltaic device, the material for the i-type semiconductor layer in the pin junction closest to the light incidence side is desirably a material having a wide bandgap; whereas the material for the i-type semiconductor layer in the pin junction farthest from the light incidence side is desirably a material having a narrow bandgap.

Amorphous silicons and amorphous silicon germaniums are denoted by a-Si:H, a-Si:F, a-Si:H:F, a-SiGe:H, a-SiGe:F, a-SiGe:H:F, and so on, depending upon the element for compensating for the dangling bonds.

Further, preferred characteristics of the i-type semiconductor layer suitable for the photovoltaic devices of the present invention are as follows: the content of hydrogen atoms ($C_H$) is 1.0 to 25.0%; the photoconductivity ($\sigma p$) under irradiation of artificial sunlight of AM 1.5 and 100 mW/cm$^2$ is not less than $1.0 \times 10^{-7}$ S/cm; the dark conductivity ($\sigma d$) is not more than $1.0 \times 10^{-9}$ S/cm; the Urback energy by the constant photocurrent method (CPM) is not more than 55 meV; the density of localized states is not more than $10^{17}$/cm$^3$.

(2) P-type semiconductor layer or n-type semiconductor layer

Amorphous (hereinafter represented by "a-") materials or microcrystalline (hereinafter represented by "$\mu c$-") materials for the p-type semiconductor layer or the n-type semiconductor layer are materials obtained by adding a high concentration of a p-type valence electron controller (atoms belonging to Group III of the periodic table; B, Al, Ga, In, and Tl) or an n-type valence electron controller (atoms belonging to Group V of the periodic table; P, As, Sb, and Bi) to, for example, a-Si:H, a-Si:HX, a-SiGe:H, a-SiGe:HX, $\mu c$-Si:H, $\mu c$-SiGe:H, $\mu c$-SiGe:HX, or the like; polycrystalline (hereinafter represented by "poly-") materials are those obtained by adding a high concentration of the p-type valence electron controller (atoms belonging to Group III of the periodic table; B, Al, Ga, In, and Tl) or the n-type valence electron controller (atoms belonging to Group V of the periodic table; P, As, Sb, and Bi) to, for example, poly-Si:H, poly-Si:HX, poly-SiGe:H, poly-SiGe:HX, poly-Si, poly-SiGe, or the like.

Particularly, a crystalline semiconductor layer absorbing little light or an amorphous semiconductor layer having a wide bandgap is suitable for the p-type layer or the n-type layer at the light incidence side.

The optimum doping amount of atoms belonging to Group III of the periodic table in the p-type layer and the optimum doping amount of atoms belonging to Group V of the periodic table in the n-type layer are 0.1 to 50 atomic %.

The hydrogen atoms (H, D) or halogen atoms contained in the p-type layer or in the n-type layer act to compensate for dangling bonds in the p-type layer or the n-type layer, thus increasing the doping efficiency of the p-type layer or the n-type layer. The optimum content of the hydrogen atoms or halogen atoms added to the p-type layer or the n-type layer is 0.1 to 40 atomic %. Particularly, when the p-type layer or the n-type layer is crystalline, the optimum content of the hydrogen atoms or halogen atoms is 0.1 to 8 atomic %. Further, a preferred distribution of the hydrogen atoms and/or halogen atoms is one in which contents of the hydrogen atoms or/and halogen atoms are higher on each interface side between the p-type layer and the i-type layer and between the n-type layer and the i-type layer, and in which a preferred range of the contents of the hydrogen atoms or/and halogen atoms near the interfaces is a range of 1.1 to 2 times as large as those in the bulk. When the contents of the hydrogen atoms or halogen atoms are higher near each interface between the p-type layer and the i-type layer and between the n-type layer and the i-type layer in this way, defect states and mechanical strain can be decreased near the interfaces, thus increasing the photoelectromotive force and photocurrent of the photovoltaic device of the present invention.

As for the electrical characteristics of the p-type layer and the n-type layer in the photovoltaic devices, the activation energy is preferably not more than 0.2 eV and most suitably not more than 0.1 eV, and the resistivity thereof is preferably not more than 100 $\Omega$cm and most suitably not more than 1 $\Omega$cm. Further, thicknesses of the p-type layer and the n-type layer are preferably 1 to 50 nm and most suitably 3 to 10 nm.

In the present invention, the transparent electrode 206, 313 is the light-incidence-side electrode for transmitting the light and also serves as an antireflection film when it has the optimum thickness.

The transparent electrode 206, 313 is required to have high transmissivity of light in the wavelength region that can be absorbed by the semiconductor layers, and to have low electrical resistivity. The transmissivity at 550 nm is preferably not less than 80% and more preferably not less than 85%. The resistivity is preferably not more than $5 \times 10^{-3}$ $\Omega$cm and more preferably not more than $1 \times 10^{-3}$ $\Omega$cm. A material for the transparent electrode may be suitably selected from conductive oxides such as $In_2O_3$, $SnO_2$, ITO ($In_2O_3+SnO_2$), ZnO, CdO, $Cd_2SnO_4$, $TiO_2$, $Ta_2O_5$, $Bi_2O_3$, $MoO_3$, or $Na_xWO_3$, or mixtures thereof.

These compounds may be doped with an element (dopant) that changes the conductivity.

The element (dopant) for varying the conductivity is selected from Al, In, B, Ga, Si, F, and so on, for example, in the case of the transparent electrode 206, 313 of ZnO; from Sn, F, Te, Ti, Sb, Pb, and so on in the case of the transparent electrode of $In_2O_3$; from F, Sb, P, As, In, Tl, Te, W, Cl, Br, I, and so on in the case of the transparent electrode of $SnO_2$.

A method for forming the transparent electrode 206, 313 is suitably selected from the vapor deposition method, the CVD method, the spray method, the spin-on method, and the dip method, and so on.

In the present invention, when the resistivity of the transparent electrode 206, 313 is not sufficiently low, the collector electrode 207, 314 is formed on a part of the transparent electrode 206, 313 if necessary, thereby functioning to lower the resistivity of the electrode and the series resistance of photovoltaic devices.

A material for the collector electrode is selected from metals such as gold, silver, copper, aluminum, nickel, iron, chromium, molybdenum, tungsten, titanium, cobalt, tantalum, niobium, or zirconium; alloys such as stainless steel; or conductive pastes using powdered metal. The shape of the collector electrode is constructed such that it minimizes blocking of the incident light into the semiconductor layers.

The percentage of the area of the collector electrode to the total area of photovoltaic device is preferably not more than 15%, more preferably not more than 10%, and most preferably not more than 5%.

A mask is used for patterning of the collector electrode and a patterning method is selected from the vapor deposition method, the sputtering method, the plating method, the printing method, and so on.

In the present invention a material for the members composing the film deposition chamber wall 102 may be either electrically conductive or electrically insulative.

Preferred materials for the wall are those with little deformation and little distortion and with desired strength.

Specifically, the material is selected suitably from thin plates of metals such as Fe, Ni, Cr, Al, Mo, Au, Nb, Ta, V, Ti, Pt, Pb, or W or alloys thereof, for example brass, stainless steel, or the like, and composites thereof.

Further, the material for the wall may also be selected from those the surface of which the above metals is coated with a metal thin film of a different metal material or with an insulating thin film of $SiO_2$, $Si_3N_4$, $AlO_3$, AlN, or the like by the sputtering method, the vapor deposition method, the plating method, or the like; glasses; ceramics; and so on.

In the present invention, a material for the cooling pipe 104, through which the refrigerant for cooling the deposition chamber wall flows, is selected preferably from those with heat resistance and corrosion resistance. Specifically, the material is selected suitably from the metals such as stainless steel. The structure of the cooling pipe 104 may be a pipe of the above metals bolted through push plates to the deposition chamber wall or may be one obtained by cutting of the above metals to form a hollow therein. Further, the cooling pipe may be formed by subjecting a plurality of the above metals processed in an uneven shape to special processing such as electrical discharge machining or welding to form the passage of refrigerant.

The heater 119 for heating the deposition chamber wall may be any heater capable of being used in the vacuum, such as a sheath type heater or a lamp type heater; particularly, a halogen infrared lamp heater is suitably applicable in terms of the response of the temperature control mechanism and reliability of operation in vacuum.

A material for the refrigerant for cooling the deposition chamber wall can be properly selected depending upon the desired temperature of the deposition chamber wall.

From easiness to handle, the refrigerant is preferably water, compressed air, or the like. If the desired temperature is high, a synthetic oil or the like will be used suitably.

When a photovoltaic device module or a photovoltaic device panel having desired output voltage and output current is produced using the photovoltaic devices of the present invention, the photovoltaic devices of the present invention are connected in series or in parallel, a protective layer is formed on the top surface and on the bottom surface, and output-deriving electrodes etc. are attached thereto. When the photovoltaic devices of the present invention are connected in series, a diode for prevention of counter current is sometimes incorporated.

An example of apparatus for producing the photovoltaic device according to the present invention will be described referring to FIG. 4.

Figure 4:
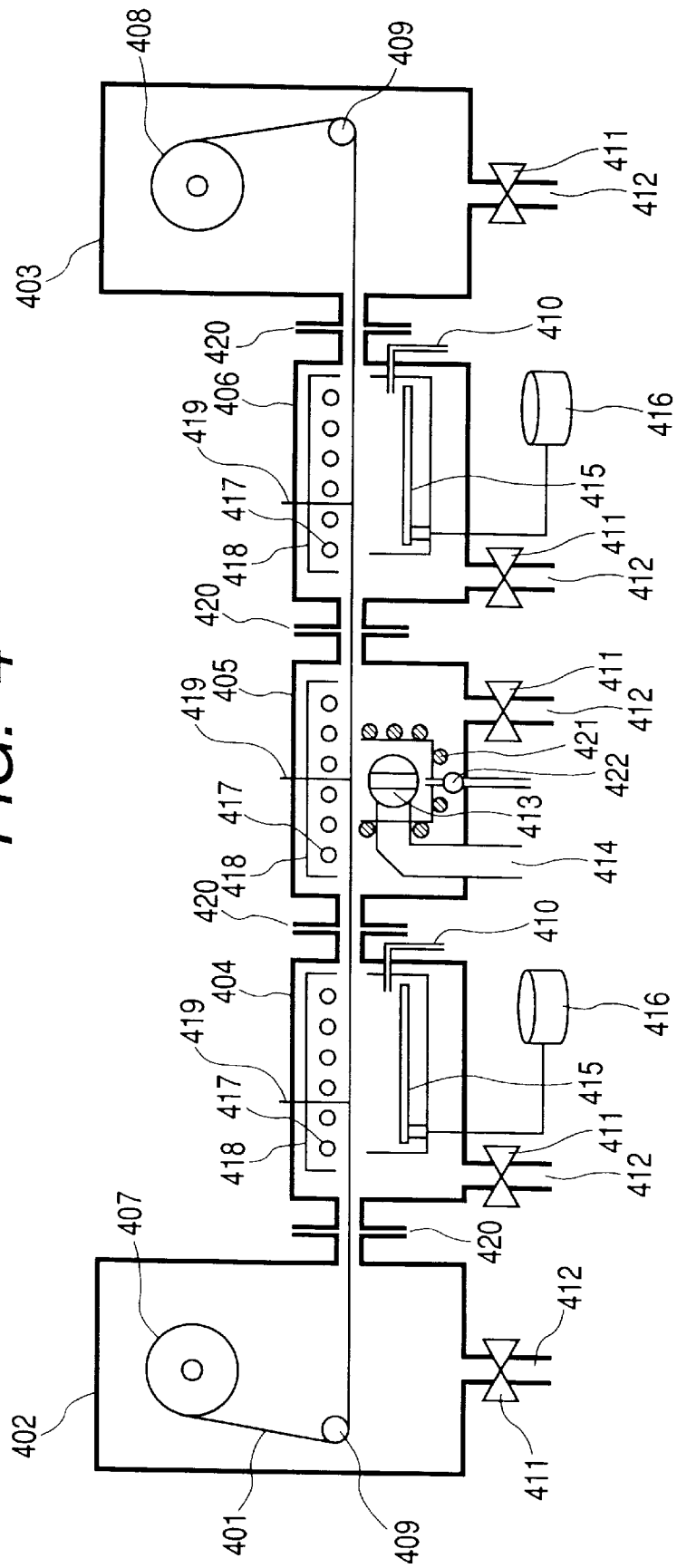
FIG. 4 is a schematic view for showing an example of an apparatus for continuously forming the photovoltaic device according to the present invention.

FIG. 4 is a schematic view for showing an example of apparatus for continuously producing the photovoltaic device of the present invention, which incorporates the i-type semiconductor layer deposition vessel 111 shown in FIG. 1. This apparatus comprises a supply chamber 402 of a beltlike substrate 401, a vessel 404 for fabrication of the n-type semiconductor layer, a vessel 405 for fabrication of the i-type semiconductor layer, a vessel 406 for fabrication of the p-type semiconductor layer and winding chamber 403 of the beltlike substrate which are connected through a gas gate.

Numeral 407 designates a bobbin for feeding the beltlike substrate 401 out and 408 a bobbin for winding the beltlike substrate 401 up. The beltlike substrate 401 is conveyed in the direction of from 407 to 408.

However, this beltlike substrate 401 can also be conveyed in the opposite direction.

Means for winding and feeding a guard sheet used for protection of the surface of the beltlike substrate 401 may be provided in the supply chamber 402 and in the winding chamber 403. Materials suitably applicable for the guard sheet are polyimide-based resins and Teflon-based resins having heat-resistant resins, glass wool, and so on. The winding means and feeding means of the guard sheet may be conveying rollers serving to adjust the tension of the beltlike substrate 401 and to position it.

Numeral 410 denotes film-forming gas inlet ports, which are in communication with a gas supply mixing box not illustrated. Numeral 420 represents gate gas introducing pipes for introducing a gate gas for separating the film-forming gases between the film-forming chambers. Numeral 411 indicates throttle valves for adjustment of conductance and 412 exhaust pipes which is connected to an exhaust pump (not illustrated). Numeral 413 is an applicator, a microwave-transmissive member is attached to the tip of the applicator and the applicator is connected through waveguide pipe 414 to a microwave power supply (not illustrated).

Numeral 415 designates the electrodes each of which is connected to power supply 416.

In each film-forming vessel 404, 405, 406, a lot of infrared lamp heaters 417 and a lamp house 418 for efficiently condensing the radiant heat from these infrared lamp heaters on the beltlike substrate 401 are provided in a space opposite to the film-forming space with interposition of the beltlike substrate 401.

Each of thermocouples 419 for monitoring the temperature of the beltlike substrate 401 is connected to and is in contact with the beltlike substrate 401.

In the present invention a bias voltage may be applied for controlling a plasma potential of a microwave-excited plasma induced in each film-forming space.

DC, pulsating current, or AC voltage is preferably applied as the bias voltage, singly or in superposition thereof. Controlling the plasma potential of the microwave-excited plasma will realize improvements in stability and repeatability of plasma and in film characteristics, and reduction of defects.

The present invention is not only effective in the cases for inducing the plasma by microwave, but also in the cases for inducing the plasma by VHF wave.

When the photovoltaic device is produced using the apparatus for continuously forming the photovoltaic device of the present invention as described above, the photovoltaic device can be produced with high quality, with uniformity, and with less defects, while solving the various problems described previously and satisfying the various requirements also described previously.

Now, specific examples will be described of the method for producing the photovoltaic device of the present invention, but it is noted that the present invention is by no means intended to be limited to these examples.

EXAMPLE 1

By using the apparatus shown in FIG. 4, the photovoltaic device was continuously produced in the following manner.

(1) The beltlike substrate 401 of SUS430BA (width 300 mm×length 300 m×thickness 0.2 mm) was sufficiently degreased and cleaned and then a thin film of silver having the thickness of 100 nm and a thin film of ZnO having the thickness of 1 $\mu$m were evaporated as a lower electrode by sputtering, respectively. The beltlike substrate 401 with the silver film and the ZnO film thus prepared was wound around the bobbin 407. The bobbin 407 with the beltlike substrate 401 was set in the vacuum vessel (supply chamber) 402 having the substrate feeding mechanism. The beltlike substrate 401 was guided through the n-type semiconductor layer forming vessel 404, i-type semiconductor layer forming vessel 405, and p-type semiconductor layer forming vessel 406 and through the respective gas gates up to the vacuum vessel (winding chamber) 403 having the beltlike substrate winding mechanism, and then the tension thereof was adjusted so as to take up the slack of the substrate.

(2) Each vacuum vessel 402, 403, 404, 405, 406 was evacuated down to $1 \times 10^{-6}$ Torr or less by the vacuum pump (not illustrated).

(3) Heat treatment before film formation: $H_2$ gas as the gate gas was allowed to flow at 500 cc/min through each gate gas introducing pipe 420 into each gas gate, He gas was introduced at 500 cc/min from each gas inlet pipe 410 into each film-forming vessel, the opening degree of each throttle valve 411 was adjusted so that the internal pressure of each vacuum vessel 402, 403, 404, 405, 406 became 1.0 Torr, and the inside of each vacuum vessel was evacuated through the exhaust pipe 412 of each vacuum vessel by the vacuum pump (not illustrated) for each vacuum vessel. After that, the beltlike substrate and the members inside the vacuum vessel were heated up to 400° C. by the lamp heaters 417 for heating and this state was kept for three hours.

(4) Each vacuum vessel 402, 403, 404, 405, 406 was evacuated down to $1 \times 10^{-6}$ Torr or less by the vacuum pump (not illustrated).

(5) Introduction of gate gas during film formation; $H_2$ gas as the gate gas was introduced at 500 cc/min through each gate gas introducing pipe 420 into each gas gate.

(6) Preparation for formation of n-type semiconductor layer: The temperature control unit (not illustrated) was set so that a temperature indication of the thermocouple became 270° C., and the beltlike substrate 401 was heated by the infrared lamp heaters 417.

$SiH_4$ gas was introduced at 100 cc/min, $PH_3/H_2$ (1%) gas at 500 cc/min, and $H_2$ gas at 700 cc/min through the film-forming gas inlet port 410 into the n-type semiconductor layer forming vessel 404. The opening degree of conductance adjusting valve 411 was adjusted and the inside was evacuated through the exhaust pipe 412 by the vacuum pump (not illustrated) so that the pressure of the discharge chamber became 1.0 Torr.

The RF (13.56 MHz) power supply 416 was set at the output of 100 W and the power was supplied to the electrode to induce discharge in the discharge chamber.

(7) Preparation for formation of i-type semiconductor layer: The temperature control unit (not illustrated) was set so that a temperature indication of the thermocouple became 360° C., and the beltlike substrate 401 was heated by the infrared lamp heaters 417. $SiH_4$ gas was introduced at 50 cc/min, $GeH_4$ gas at 50 cc/min, and $H_2$ gas at 200 cc/min through the gas inlet pipe from the gas manifold 422 into the i-type semiconductor layer forming vessel 405. The opening degree of the throttle valve 411 for adjustment of conductance was adjusted and the inside was evacuated by the vacuum pump (not illustrated) so that the pressure of the discharge chamber became 20 mTorr. The microwave (2.45 GHz) power was introduced to the applicator 413, and the microwave power of 200 W was introduced through the microwave-transmissive member into the discharge chamber to induce discharge therein. Water was allowed to flow through the film deposition chamber wall-cooling pipe 421, and the film deposition chamber was controlled at the constant temperature of 250° C. by the deposition-chamber-wall-heating heater (not illustrated) while being cooled.

(8) Preparation for formation of p-type semiconductor layer: The temperature control unit (not illustrated) was set so that a temperature indication of the thermocouple became 150° C., and the beltlike substrate 401 was heated by the infrared lamp heaters 417. $SiH_4$ gas was introduced at 10 cc/min, $BH_3/H_2$ (1%) gas at 200 cc/min, and $H_2$ gas at 1000 cc/min through the gas inlet port 410 into the p-type semiconductor layer forming vessel 406. The opening degree of the throttle valve 411 for adjustment of conductance was adjusted and the inside was evacuated through the exhaust pipe 412 by the vacuum pump (not illustrated) so that the pressure of the discharge chamber became 1.0 Torr. The RF power supply 416 was set at the output of 1000 W, and the power was supplied through the electrode to induce discharge in the discharge chamber.

(9) The beltlike substrate 401 was conveyed at the speed of 1300 mm/min from the supply chamber 402 to the winding chamber 403, whereupon the n-type semiconductor layer, i-type semiconductor layer, and p-type semiconductor layer were produced on the beltlike substrate.

(10) After one roll of the beltlike substrate has been conveyed, all the plasmas, all the gas supplies, energization of all the lamp heaters, and conveyance of the beltlike substrate were terminated. Then $N_2$ gas was introduced to each chamber (members for introducing the $N_2$ gas are not illustrated) to bring the inside back to the atmospheric pressure. Then the beltlike substrate wound around the winding bobbin 408 was taken out.

(11) ITO ($In_2O_3+SnO_2$) was evaporated in the thickness of 100 nm as a transparent electrode on the p-type semiconductor layer by vacuum vapor deposition. Further, Al was evaporated in the thickness of 2 $\mu$m as a collector electrode by vacuum vapor deposition. The photovoltaic device (sample No. 1) shown in FIG. 2 was produced as described above.

The production conditions of the photovoltaic device described above are shown in Table 1.

TABLE 1

| Substrate | SUS430BA width 300 mm thickness 0.2 mm |
| Reflecting layer | Silver (Ag) thin film 100 nm |
| Reflection enhancing layer | Zinc oxide (ZnO) thin film 1 $\mu$m |
| Gate gas | $H_2$ from each gate 500 cc/min |

| Name of layer | Flow rate of gas (cc/min) | Discharge power (W) | Pressure (Torr) | Temperature of substrate (° C.) | Temperature of deposition chamber (° C.) |
|---|---|---|---|---|---|
| Production conditions of each layer | | | | | |
| n-type layer | $SiH_4$ 100<br>$PH_3/H_2$ 500<br>(1% dilution)<br>$H_2$ 700 | 100 (RF) | 1.0 | 270 | 270 |
| i-type layer | $SiH_4$ 50<br>$GeH_4$ 50<br>$H_2$ 200 | 200 ($\mu$w) | 0.02 | 360 | 250 |

TABLE 1-continued

| Substrate | SUS430BA width 300 mm thickness 0.2 mm |
| Reflecting layer | Silver (Ag) thin film 100 nm |
| Reflection enhancing layer | Zinc oxide (ZnO) thin film 1 μm |
| Gate gas | $H_2$ from each gate 500 cc/min |

| Name of layer | Flow rate of gas (cc/min) | Discharge power (W) | Pressure (Torr) | Temperature of substrate (° C.) | Temperature of deposition chamber (° C.) |
|---|---|---|---|---|---|
| p-type layer | SiH4 10<br>$BF_3/H_2$ 200<br>(1% dilution)<br>$H_2$ 1000 | 1000 (RF) | 1.0 | 150 | 150 |
| Transparent electrode | ITO ($In_2O_3$ + $SnO_2$) thin film 100 nm | | | | |
| Collector electrode | aluminum (Al) thin filter 2 μm | | | | |

(Comparative Example 1)

In this example, the photovoltaic device was produced in the same manner as in Example 1 except for the difference from Example 1 as described below.

The production conditions were the same as in Example 1 except that the water cooling of the i-type semiconductor layer deposition chamber wall was not carried out and that the apparatus was used in which the gas manifold was integrally incorporated into the film deposition chamber wall.

The photovoltaic device (comparative sample No. 1) was produced on one roll of beltlike substrate in the same manner as in Example 1 except for the above point.

Each of the photovoltaic device (sample No. 1) obtained in Example 1 and the photovoltaic device (comparative sample No. 1) obtained in Comparative Example 1 was first evaluated as to the photoelectric conversion efficiency η={maximum power generated per unit area $(mW/cm^2)$/intensity of incident light per unit area $(mW/cm^2)$}.

Five photovoltaic devices were prepared for each of sample No. 1 of Example 1 and comparative sample No. 1 of Comparative Example 1, they were placed under irradiation of AM-1.5 (100 $mW/cm^2$) light, DC voltage was applied to the upper electrode, current-voltage characteristics were measured, and they were evaluated as to the open-circuit voltage, fill factor, and photoelectric conversion efficiency η. The results showed that the photovoltaic devices of sample No. 1 had the average value of open-circuit voltage being 1.14 times, the average value of fill factor being 1.1 times, and the average value of photoelectric conversion efficiency η being 1.25 times superior to those of the photovoltaic devices of comparative sample No. 1.

Each of the photovoltaic devices produced in Example 1 and the photovoltaic devices (comparative sample No. 1) produced in Comparative Example 1 was encapsulated in vacuum by a protective film of polyvinylidene fluoride (VDF) and they were placed under real operating conditions (where they were installed outdoors and a fixed resistor of 50 Ω was connected to the both electrodes) for one year. After that, they were again evaluated as to the photoelectric conversion efficiency, and deterioration rates due to the exposure to the light (a deterioration rate is obtained by dividing a loss value of photoelectric conversion efficiency due to deterioration by the initial photoelectric conversion efficiency) were evaluated. The results showed that the deterioration rates of the photovoltaic devices (sample No. 1) formed according to the present invention were 40% with respect to those of the photovoltaic devices (comparative sample No. 1) with the i-type semiconductor layer formed according to the conventional method.

The above confirmed that the photovoltaic devices produced according to the present invention were drastically improved in the photoelectric conversion efficiency and also greatly improved in reliability under real operating conditions.

EXAMPLE 2

The photovoltaic device (sample No. 2) was produced by successively forming the n-type semiconductor layer, i-type semiconductor layer, p-type semiconductor layer, transparent electrode, and collector electrode in the same manner as in Example 1 except that the production conditions of the i-type semiconductor layer were changed to those in Table 2.

TABLE 2

| Substrate | SUS430BA width 300 mm thickness 0.2 mm |
| Reflecting layer | Silver (Ag) thin film 100 nm |
| Reflection enhancing layer | Zinc oxide (ZnO) thin film 1 μm |
| Gate gas | $H_2$ from each gate 500 cc/min |

| Name of layer | Flow rate of gas (cc/min) | Discharge power (W) | Pressure (Torr) | Temperature of substrate (° C.) | Temperature of deposition chamber (° C.) |
|---|---|---|---|---|---|
| Production conditions of each layer | | | | | |
| n-type layer | $SiH_4$ 100<br>$PH_3/H_2$ 500<br>(1% dilution)<br>$H_2$ 700 | 100 (RF) | 1.0 | 270 | 270 |
| i-type layer | $SiH_4$ 50<br>$H_2$ 200 | 200 (μw) | 0.02 | 340 | 250 |
| p-type layer | SiH4 10<br>$BF_3/H_2$ 200<br>(1% dilution)<br>$H_2$ 1000 | 1000 (RF) | 1.0 | 150 | 150 |
| Transparent electrode | ITO ($In_2O_3$ + $SnO_2$) thin film 100 nm | | | | |
| Collector electrode | aluminum (Al) thin filter 2 μm | | | | |

(Comparative Example 2)

In this example, the photovoltaic device was produced in the same manner as in Example 2 except for the production conditions of the i-type semiconductor layer. The difference from Example 2 was as follows.

The production conditions were the same as in Example 2 except that the water cooling of the i-type semiconductor layer deposition wall was not carried out and the apparatus was used in which the gas manifold was integrally incorporated into the film deposition chamber wall.

The photovoltaic device (comparative sample No. 2) was produced on one roll of beltlike substrate in the same manner as in Example 2 except for the above point.

Each of the photovoltaic device (sample No. 2) obtained in Example 2 and the photovoltaic device (comparative sample No. 2) obtained in Comparative Example 2 was first evaluated as to the photoelectric conversion efficiency η.

Five photovoltaic devices were prepared for each of sample No. 2 of Example 2 and comparative sample No. 2 of Comparative Example 2, they were placed under irradiation of AM-1.5 (100 mW/cm$^2$) light, the DC voltage was applied to the upper electrode, the current-voltage characteristics were measured, and they were evaluated as to the open-circuit voltage, fill factor, and photoelectric conversion efficiency η. The results showed that the photovoltaic devices of sample No. 2 had the average value of open-circuit voltage being 1.17 times, the average value of fill factor being 1.1 times, and the average value of photoelectric conversion efficiency η being 1.3 times superior to those of the photovoltaic devices of comparative sample No. 2.

Each of the photovoltaic devices produced in Example 2 and the photovoltaic devices (comparative sample No. 2) produced in Comparative Example 2 was encapsulated in vacuum by the protective film of polyvinylidene fluoride (VDF) and they were placed under the real operating conditions (where they were installed outdoors and a fixed resistor of 50 Ω was connected to both electrodes) for one year. After that, they were again evaluated as to the photoelectric conversion efficiency, and deterioration rates due to the exposure to the light (a deterioration rate is obtained by dividing a loss value of photoelectric conversion efficiency due to deterioration by the initial photoelectric conversion efficiency) were checked. The results showed that the deterioration rates of the photovoltaic devices (sample No. 2) formed according to the present invention were 50% with respect to those of the photovoltaic devices (comparative sample No. 2) with the i-type semiconductor layer formed according to the conventional method.

The above confirmed that the photovoltaic devices produced according to the present invention were drastically improved in photoelectric conversion efficiency and also greatly improved in reliability under real operating conditions.

EXAMPLE 3

In Example 1 the film deposition chamber wall was controlled at the constant temperature of 200° C. for producing the i-type semiconductor layer, whereas the present example adopted the cooling medium of oil instead of water so as to realize the constant temperature of 330° C. and thus the experiment was carried out at the temperature.

The photovoltaic device (sample No. 3) was produced by successively forming the n-type semiconductor layer, i-type semiconductor layer, p-type semiconductor layer, transparent electrode, and collector electrode in the same manner as in Example 1 except for the above point.

Each of the photovoltaic device (sample No. 3) obtained in Example 3 and the photovoltaic device (comparative sample No. 2) obtained in Comparative Example 2 was first evaluated as to the photoelectric conversion efficiency η.

Five photovoltaic devices were prepared for each of sample No. 3 of Example 3 and comparative sample No. 2 of Comparative Example 2, they were placed under irradiation of AM-1.5 (100 mW/cm$^2$) light, DC voltage was applied to the upper electrode, the current-voltage characteristics were measured, and they were evaluated as to the open-circuit voltage, fill factor, and photoelectric conversion efficiency η. The results showed that the photovoltaic devices of sample No. 3 had the average value of open-circuit voltage being 1.19 times, the average value of fill factor being 1.2 times, and the average value of photoelectric conversion efficiency η being 1.4 times superior to those of the photovoltaic devices of comparative sample No. 2.

Each of the photovoltaic devices produced in Example 3 and the photovoltaic devices (comparative sample No. 2) produced in Comparative Example 2 was encapsulated in vacuum by the protective film of polyvinylidene fluoride (VDF) and they were placed under the real operating conditions (where they were installed outdoor and a fixed resistor of 50 Ω was connected to both electrodes) for one year. After that, they were again evaluated as to photoelectric conversion efficiency, and deterioration rates due to the exposure to the light (a deterioration rate is obtained by dividing a loss value of photoelectric conversion efficiency due to deterioration by the initial photoelectric conversion efficiency) were evaluated. The results showed that the deterioration rates of the photovoltaic devices (sample No. 3) with the i-type semiconductor layer formed according to the present invention were 50% in ratio to those of the photovoltaic devices (comparative sample No. 2) with the p-type semiconductor layer formed according to the conventional method.

The above confirmed that the photovoltaic devices produced according to the present invention were drastically improved in the photoelectric conversion efficiency and also greatly improved in reliability under the real operating conditions.

EXAMPLE 4

In Example 1 one pin junction was provided on the surface of the lower electrode, whereas the present example adopted a stack of three pin junctions. The stack structure of three pin junctions as described is called as a triple type photovoltaic device.

In this example the photovoltaic device was produced in the same manner as in Example 1 except that the discharge inducing means for forming the i-type semiconductor layer in the light-incidence-side pin junction was RF discharge.

For producing the above triple type photovoltaic device, the apparatus was provided with additional vessels, i.e., n-type semiconductor layer forming vessel, i-type semiconductor layer forming vessel, p-type semiconductor layer forming vessel, n-type semiconductor layer forming vessel, i-type semiconductor layer forming vessel, and p-type semiconductor layer forming vessel connected through a gas gate, between the p-type semiconductor layer forming vessel 406 and the winding chamber 403 of the deposited film forming apparatus shown in FIG. 4.

The i-type semiconductor layers of the first and second pin junctions were made of a-SiGe:H and the i-type semiconductor layer of the third pin junction was made of a-Si:H. The production conditions are shown in Table 3. The order of the stack was the order from the top to the bottom of Table 3.

Subsequently, by use of a continuous module forming apparatus (not illustrated), the produced photovoltaic device was processed into many photovoltaic device modules of the size of 36 cm×22 cm. The photovoltaic device modules thus processed were evaluated as to characteristics using the artificial sunlight of AM 1.5 and energy density of 100 mW/cm$^2$. The photoelectric conversion efficiencies obtained were 7.8% or more. Variations in characteristics among the photovoltaic device modules were within 5%. Two samples were selected out of the photovoltaic device modules thus processed and were subjected to continuous 200 repetitive bending tests. After the tests, the characteristics showed no degradation and the phenomenon of exfoliation of a deposited film or the like was not recognized. Further, even after the samples were exposed to continuous 500-hour irradiation of the artificial sunlight of AM 1.5 and energy density of 100 mW/cm² described above, the decrease of photoelectric conversion efficiency was within 8.5% of the initial value. A power supply system of output 5 kW was able to be constructed by connecting the photovoltaic device modules. The relation between time from start of deposition and temperature of the deposition chamber wall is shown by marks ○ in FIG. 5. It is seen from FIG. 5 that the temperature of deposition chamber wall is stable at 250° C. for a long period of time. The relation between time from start of deposition and photoelectric conversion efficiency of photovoltaic device module obtained is shown by marks □ in FIG. 6. It is seen from FIG. 6 that the photoelectric conversion efficiency is stable at about 7.8% even after the deposition for a long period of time.

TABLE 3

| | Substrate | SUS430BA width 300 mm thickness 0.2 mm | | | |
|---|---|---|---|---|---|
| | Reflecting layer | Silver (Ag) thin film 100 nm | | | |
| | Reflection enhancing layer | Zinc oxide (ZnO) thin film 1 μm | | | |
| | Gate gas | $H_2$ from each gate 500 cc/min | | | |

| Name of layer | Flow rate of gas (cc/min) | Discharge power (W) | Pressure (Torr) | Temperature of substrate (° C.) | Temperature of deposition chamber (° C.) |
|---|---|---|---|---|---|
| Production conditions of each layer | | | | | |
| n-type layer | $SiH_4$ 100<br>$PH_3/H_2$ 500<br>(1% dilution)<br>$H_2$ 700 | 100 (RF) | 1.0 | 270 | 270 |
| i-type layer | $SiH_4$ 50<br>$GeH_4$ 50<br>$H_2$ 200 | 200 (μw) | 0.02 | 360 | 250 |
| p-type layer | $SiH_4$ 100<br>$BF_3/H_2$ 50<br>(1% dilution)<br>$H_2$ 700 | 1000 (RF) | 1.0 | 150 | 150 |
| n-type layer | $SiH_4$ 50<br>$PH_3/H_2$ 500<br>(1% dilution)<br>$H_2$ 1000 | 50 (RF) | 1.0 | 220 | 220 |
| i-type layer | $SiH_4$ 45<br>$GeH_4$ 40<br>$H_2$ 100 | 180 (μw) | 0.015 | 340 | 250 |
| p-type layer | $SiH_4$ 100<br>$PH_3/H_2$ 500<br>(1% dilution)<br>$H_2$ 700 | 1000 (RF) | 1.0 | 150 | 150 |
| n-type layer | $SiH_4$ 100<br>$PH_3/H_2$ 500<br>(1% dilution)<br>$H_2$ 700 | 80 (RF) | 1.0 | 220 | 220 |
| i-type layer | $SiH_4$ 50<br>$H_2$ 200 | 100 (RF) | 1.0 | 250 | 250 |
| p-type layer | $SiH_4$ 10<br>$BF_3/H_2$ 50<br>(1% dilution)<br>$H_2$ 1000 | 1000 (RF) | 1.0 | 150 | 150 |
| Transparent electrode | ITO ($In_2O_3$ + $SnO_2$) thin film 100 nm | | | | |
| Collector electrode | aluminum (Al) thin filter 2 μm | | | | |

(Comparative Example 3)

In this example the photovoltaic device was produced in the same manner as in Example 4 except for the production conditions of the i-type semiconductor layer. The difference from Example 4 was as follows.

The photovoltaic device was made under the same conditions except that the water cooling of the i-type semiconductor layer deposition chamber wall was not carried out and that the apparatus was used in which the gas manifold was integrally incorporated into the deposition chamber wall.

Figure 5:
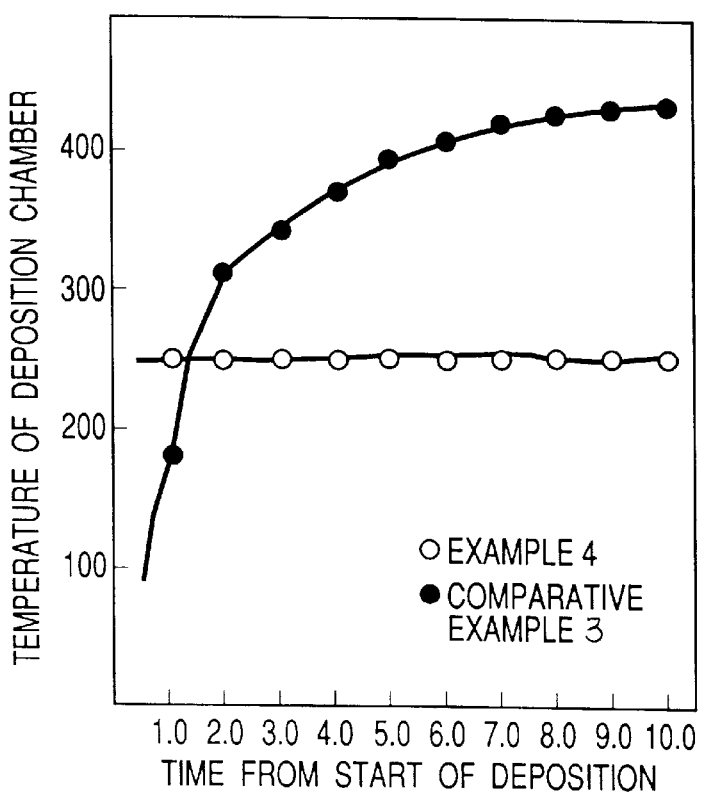
FIG. 5 is a graph showing the relation between time from start of deposition and temperature of deposition chamber wall, in Example 4 and Comparative Example 3.
Figure 6:
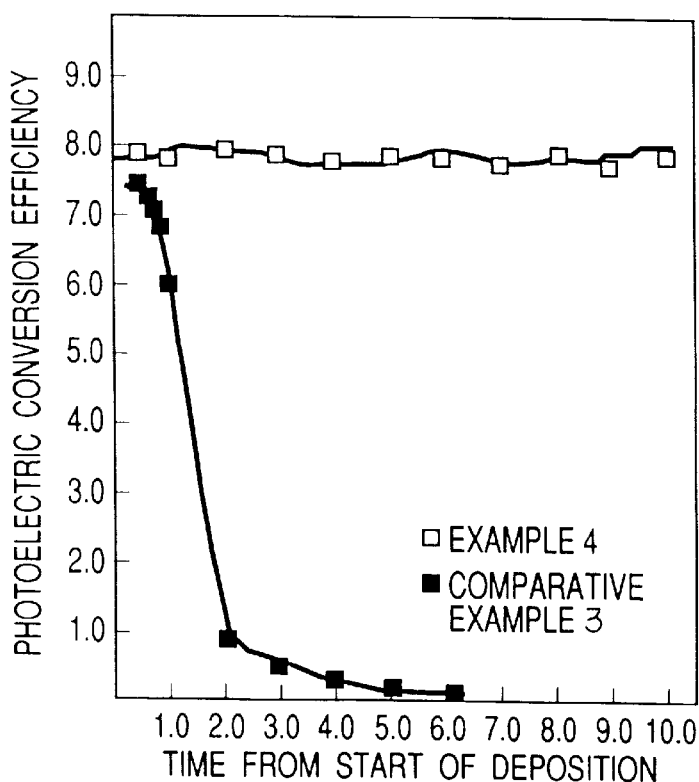
FIG. 6 is a graph showing the relation between time from start of deposition and photoelectric conversion efficiency of photovoltaic device module obtained, in Example 4 and Comparative Example 3.

Similarly to Example 4, the temporal changes in the temperature of deposition chamber wall and the photoelectric conversion efficiency against the time from start of deposition are shown by marks ● in FIG. 5 and by marks ■ in FIG. 6, respectively. It is seen from FIG. 5 and FIG. 6 that after several hours from the start of deposition, the temperature of deposition chamber wall increased over the preferred temperature range and the photoelectric conversion efficiency dropped steeply.

EXAMPLE 5

Example 4 described above employed the a-Si:H deposited films as the p-type semiconductor layers, whereas this example used a-SiC:H deposited films instead of the a-Si:H deposited films to produce the photovoltaic device, which was processed into photovoltaic device modules. The production conditions are shown in Table 4. The photovoltaic device modules thus processed were evaluated as to the same characteristics as in Example 4. The photoelectric conversion efficiencies obtained were 7.8% or more and variations in the characteristics among the photovoltaic device modules were within 5%. Even after the continuous 200 repetitive bending tests, the characteristics showed no degradation and exfoliation of a deposited film did not occur. Further, even after the continuous 500-hour irradiation of the artificial sunlight, changes in the photoelectric conversion efficiency were within 8.3% of the initial value. A power supply system of output 5 kW was able to be constructed using the photovoltaic device modules.

TABLE 4

| | Substrate | SUS430BA width 300 mm thickness 0.2 mm | | | |
|---|---|---|---|---|---|
| | Reflecting layer | Silver (Ag) thin film 100 nm | | | |
| | Reflection enhancing layer | Zinc oxide (ZnO) thin film 1 μm | | | |
| | Gate gas | $H_2$ from each gate 500 cc/min | | | |

| Name of layer | Flow rate of gas (cc/min) | Discharge power (W) | Pressure (Torr) | Temperature of substrate (° C.) | Temperature of deposition chamber (° C.) |
|---|---|---|---|---|---|
| Production conditions of each layer | | | | | |
| n-type layer | $SiH_4$ 100<br>$PH_3/H_2$ 500<br>(1% dilution)<br>$H_2$ 700 | 100 (RF) | 1.0 | 270 | 270 |
| i-type layer | $SiH_4$ 50<br>$GeH_4$ 50<br>$H_2$ 200 | 200 (μW) | 0.02 | 360 | 250 |
| p-type layer | $SiH_4$ 100<br>$CH_4$ 20<br>$BF_3/H_2$ 50<br>(1% dilution)<br>$H_2$ 700 | 1000 (RF) | 1.0 | 150 | 150 |

TABLE 4-continued

| Substrate | SUS430BA width 300 mm thickness 0.2 mm |
|---|---|
| Reflecting layer | Silver (Ag) thin film 100 nm |
| Reflection enhancing layer | Zinc oxide (ZnO) thin film 1 μm |
| Gate gas | $H_2$ from each gate 500 cc/min |

| Name of layer | Flow rate of gas (cc/min) | Discharge power (W) | Pressure (Torr) | Temperature of substrate (° C.) | Temperature of deposition chamber (° C.) |
|---|---|---|---|---|---|
| n-type layer | $SiH_4$ 50<br>$PH_3/H_2$ 500<br>(1% dilution)<br>$H_2$ 1000 | 50 (RF) | 1.0 | 220 | 220 |
| i-type layer | $SiH_4$ 45<br>$GeH_4$ 40<br>$H_2$ 100 | 180 (μw) | 0.015 | 340 | 250 |
| p-type layer | $SiH_4$ 100<br>$CH_4$ 20<br>$PH_3/H_2$ 500<br>(1% dilution)<br>$H_2$ 700 | 1000 (RF) | 1.0 | 150 | 150 |
| n-type layer | $SiH_4$ 100<br>$PH_3/H_2$ 500<br>(1% dilution)<br>$H_2$ 700 | 80 (RF) | 1.0 | 220 | 220 |
| i-type layer | $SiH_4$ 50<br>$H_2$ 200 | 100 (RF) | 1.0 | 250 | 250 |
| p-type layer | $SiH_4$ 10<br>$CH_4$ 20<br>$BF_3/H_2$ 50<br>(1% dilution)<br>$H_2$ 1000 | 1000 (RF) | 1.0 | 150 | 150 |
| Transparent electrode | ITO ($In_2O_3$ + $SnO_2$) thin film 100 nm | | | | |
| Collector electrode | aluminum (Al) thin filter 2 μm | | | | |

What is claimed is:

1. An apparatus for forming a non-single-crystal semiconductor thin film, comprising: a film deposition chamber having a film-forming space surrounded by a film deposition chamber wall and a beltlike substrate; an external chamber surrounding the deposition chamber wall; and a gas supply means, wherein while the beltlike substrate is moved in a longitudinal direction thereof, a film-forming gas is introduced through the gas supply means into the film-forming space and a plasma is induced in the film-forming space, thereby forming a non-single-crystal semiconductor thin film on a surface of the beltlike substrate, and wherein the gas supply means comprises a gas manifold, the gas manifold being set apart from the deposition chamber wall.

2. An apparatus for forming a non-single-crystal semiconductor thin film according to claim 1, wherein the outside surface of the deposition chamber wall comprises a beltlike substrate, an applicator surface having the applicator means, an exhaust surface having a gas exhaust means, and a surface other than the beltlike substrate surface, the applicator surface and the exhaust surface, and wherein a cooling mechanism and a temperature-increasing mechanism are provided on the applicator surface or on the other surface.

3. An apparatus for forming a non-single-crystal semiconductor thin film according to claim 1, wherein a cooling mechanism and a temperature-increasing mechanism are provided such that the mechanisms cover a part of an outside surface of the deposition chamber wall.

4. An apparatus for forming a non-single-crystal semiconductor thin film according to claim 1, further comprising means for introducing a microwave or a VHF wave into the film-forming space.

* * * * *

UNITED STATES PATENT AND TRADEMARK OFFICE
CERTIFICATE OF CORRECTION

PATENT NO. : 6,159,300
DATED : December 12, 2000
INVENTOR(S) : Tadashi Hori et al.

It is certified that error appears in the above-identified patent and that said Letters Patent is hereby corrected as shown below:

Column 2,
Line 27, "therefor." should read -- thereof. --.

Column 6,
Line 35, "baths." should read -- paths. --; and
Line 58, "baths" should read -- paths --.

Column 8,
Line 61, "the" should read -- a --.

Signed and Sealed this

Twenty-fifth Day of December, 2001

Attest:

Attesting Officer

JAMES E. ROGAN
Director of the United States Patent and Trademark Office